(12) United States Patent
Gieskes

(10) Patent No.: US 10,052,705 B2
(45) Date of Patent: Aug. 21, 2018

(54) 3D TSV ASSEMBLY METHOD FOR MASS REFLOW

(71) Applicant: UNIVERSAL INSTRUMENTS CORPORATION, Conklin, NY (US)

(72) Inventor: Koenraad Alexander Gieskes, Deposit, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 42 days.

(21) Appl. No.: 14/413,121

(22) PCT Filed: Aug. 29, 2013

(86) PCT No.: PCT/US2013/057289
§ 371 (c)(1),
(2) Date: Jan. 6, 2015

(87) PCT Pub. No.: WO2014/036257
PCT Pub. Date: Mar. 6, 2014

(65) Prior Publication Data
US 2015/0165537 A1    Jun. 18, 2015

Related U.S. Application Data

(60) Provisional application No. 61/695,092, filed on Aug. 30, 2012.

(51) Int. Cl.
*B23K 1/00* (2006.01)
*B23K 3/08* (2006.01)
(Continued)

(52) U.S. Cl.
CPC ............ *B23K 3/087* (2013.01); *B23K 1/0016* (2013.01); *B23K 3/04* (2013.01); *H01L 24/75* (2013.01);
(Continued)

(58) Field of Classification Search
CPC .. B23K 2201/40; B23K 1/0016; B23K 3/087; B23K 20/023; B23K 37/0408;
(Continued)

(56) References Cited

U.S. PATENT DOCUMENTS 4,792,302 A * 12/1988 Baker .................. F27B 9/3005
432/175
6,185,816 B1 * 2/2001 Freund .................. H01L 21/681
257/797
(Continued)

FOREIGN PATENT DOCUMENTS

DE        112013004281 T5     5/2015
EP               2264113 A2 * 12/2010 ............ C09J 123/24
(Continued)

OTHER PUBLICATIONS

JP 11260859 A computer english translation.*
International Search Report and Written Opinion for PCT Application No. PCT/US13/57289, dated Feb. 7, 2014.

*Primary Examiner* — Erin B Saad
(74) *Attorney, Agent, or Firm* — Schmeiser, Olsen & Watts, LLP

(57) ABSTRACT

Disclosed herein is a method that includes picking up a plate with a nozzle, the plate including at least one opening to allow air to flow therethrough. The method includes picking up a die with the nozzle such that the plate is located between the nozzle and the die. The method includes placing the die and the plate onto a device, substrate or another die such that the plate is located on top of the die. The method includes heating the device, substrate or another die and the die in a heat chamber while the plate remains on top of the die to permanently attach the die to the device, substrate or another die. Further disclosed herein is an assembly system (Continued)

configured to perform a method that utilizes the plate and die combination for attaching the die to a device, substrate or another die by heating.

13 Claims, 5 Drawing Sheets

(51) Int. Cl.
  *H01L 23/00* (2006.01)
  *H01L 25/00* (2006.01)
  *B23K 3/04* (2006.01)
  *H01L 25/065* (2006.01)

(52) U.S. Cl.
  CPC .............. *H01L 24/81* (2013.01); *H01L 25/50* (2013.01); *B23K 2001/12* (2013.01); *H01L 25/0657* (2013.01); *H01L 2224/16145* (2013.01); *H01L 2224/16227* (2013.01); *H01L 2224/7555* (2013.01); *H01L 2224/7565* (2013.01); *H01L 2224/75272* (2013.01); *H01L 2224/75745* (2013.01); *H01L 2224/81005* (2013.01); *H01L 2224/81011* (2013.01); *H01L 2224/8121* (2013.01); *H01L 2224/81121* (2013.01); *H01L 2224/81191* (2013.01); *H01L 2224/81815* (2013.01); *H01L 2224/97* (2013.01); *H01L 2225/06513* (2013.01); *H01L 2225/06541* (2013.01)

(58) Field of Classification Search
  CPC .... B23K 2201/42; B23K 26/20; B23K 31/02; B23K 37/0443
  USPC .......... 228/180.1, 234.1, 102, 228, 4.1, 44.3
  See application file for complete search history.

(56) References Cited

U.S. PATENT DOCUMENTS

| | | |
|---|---|---|
| 6,279,815 B1 | 8/2001 | Correia et al. |
| 6,565,706 B2 | 5/2003 | Moriuchi |
| 7,034,401 B2 | 4/2006 | Savastiouk |
| 7,759,165 B1 | 7/2010 | Bajaj |
| 7,790,597 B2 | 9/2010 | Chauhan et al. |
| 7,969,013 B2 | 4/2011 | Chen et al. |
| 2004/0154529 A1 | 8/2004 | Nogiwa et al. |
| 2005/0045914 A1 | 3/2005 | Agranat et al. |
| 2006/0040521 A1* | 2/2006 | Gordon .............. H05K 13/0069 439/66 |
| 2007/0181644 A1 | 8/2007 | Ueno et al. |
| 2009/0064489 A1* | 3/2009 | Inoue .................. H05K 3/3484 29/739 |
| 2009/0321948 A1 | 12/2009 | Wang et al. |
| 2011/0092030 A1 | 4/2011 | Or-Bach et al. |
| 2012/0012645 A1* | 1/2012 | Motomura ............. H05K 3/363 228/179.1 |
| 2012/0070939 A1 | 3/2012 | Dunne et al. |

FOREIGN PATENT DOCUMENTS

| | | | |
|---|---|---|---|
| JP | H07297595 A | | 11/1995 |
| JP | 01064300 A | | 3/1998 |
| JP | H11017397 A | | 1/1999 |
| JP | 11260859 A | * | 9/1999 |
| JP | 2001179671 A | | 7/2001 |
| JP | 2006253249 A | | 9/2006 |
| JP | 2010232414 A | | 10/2010 |
| JP | 2010272650 A | | 12/2010 |
| SG | 11201500364 | | 8/2017 |

\* cited by examiner

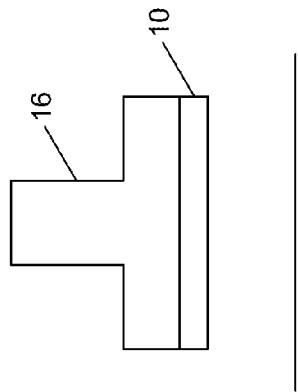
FIG. 4a
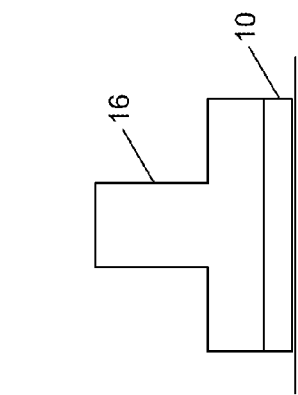
FIG. 4b
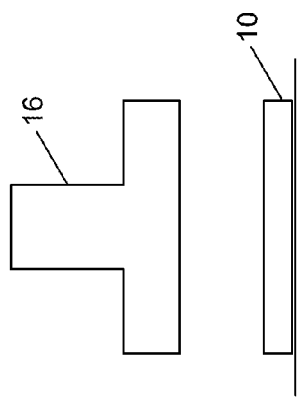
FIG. 4c
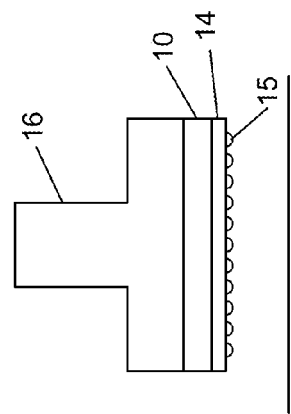
FIG. 5a
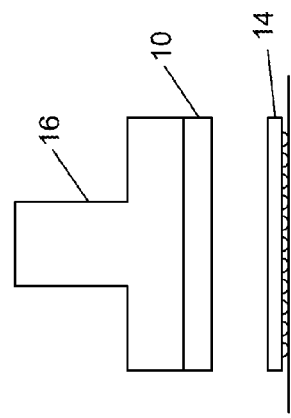
FIG. 5b
FIG. 5c

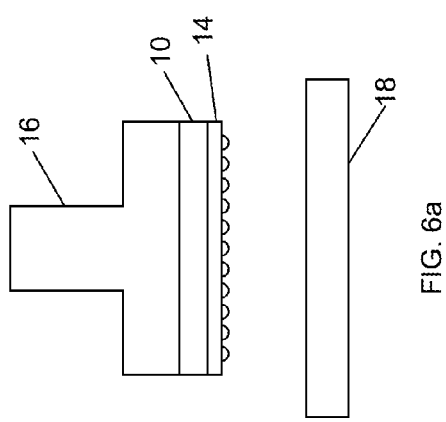
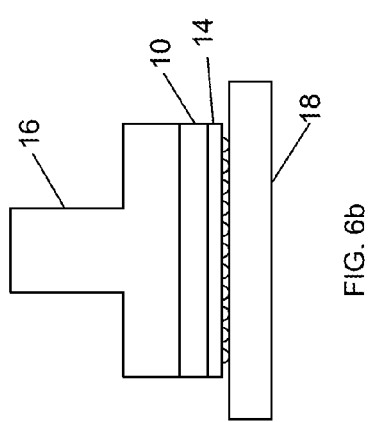
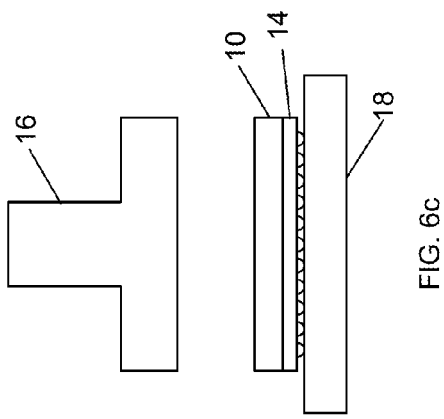
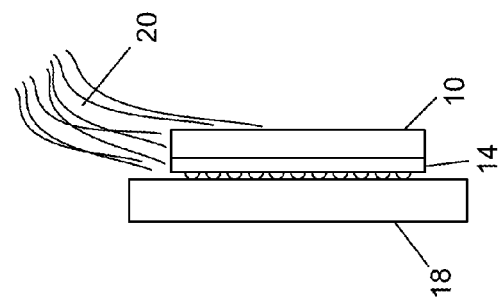
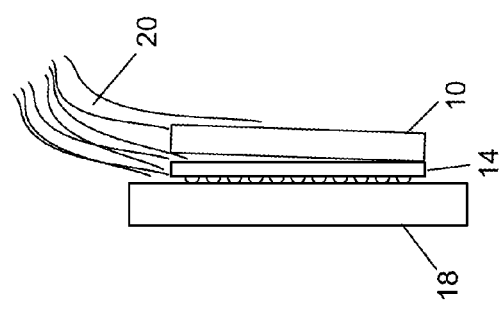
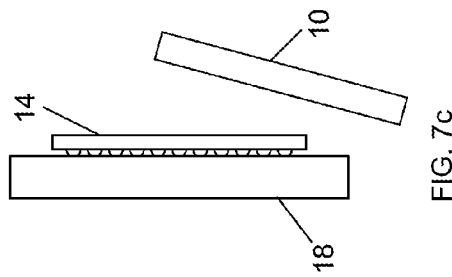

3D TSV ASSEMBLY METHOD FOR MASS REFLOW

CROSS REFERENCE TO RELATED APPLICATIONS

This application claims the benefit of U.S. Provisional Application No. 61/695,092, filed Aug. 30, 2012, entitled 3D TSV ASSEMBLY METHOD FOR MASS REFLOW.

BACKGROUND

1. Technical Field

This disclosure relates generally to electronic assembly. More particularly, the present disclosure relates to the assembly method of a die on a substrate or a die on another die as part of a 3D assembly (also called 3D through-silicon vias ("TSV")) for mass reflow or reflow soldering.

2. Related Art

The dies in a die on die or 3D TSV assembly can be so thin that during the heating or a mass reflow or bonding process the die has a tendency to curl up. This is referred to in the industry as the "potato chip" effect. The "potato chip" effect leaves many bad connections between the base die and the upper die. The current solution for this problem is to use a special nozzle that will enable in situ bonding of the die at the time of placement. The problem with this solution is that often the die needs to be thermally processed before the nozzle can be removed. To accelerate this, the nozzle must be heated and must also be able to be quickly cooled. The entire placement process, therefore, of the die by the nozzle, takes a significant amount of time for each die because the nozzle must remain at the placement location in order to heat and cool the die before moving to pick up another part. Even though progress has been made, the above process of heating and cooling results in a very low placement rate. Moreover, the equipment required to perform these processes is expensive because the accuracy of placement that is required. Therefore, the equipment cost and the time cost (with tact times in the 5 to 60 seconds per die) makes this an expensive process step in a TSV assembly. Additionally, the use of local heating and cooling at the nozzle tip makes it more difficult to reach the required accuracy in the placement and attachment steps.

Thus, a die on die or 3D TSV assembly method and assembly machine compatible with a mass reflow method that alleviates or prevents many of the problems described hereinabove would be well received in the art.

BRIEF DESCRIPTION

According to one embodiment, a method comprises: picking up a plate with a nozzle, the plate including at least one opening to allow air to flow therethrough; picking up a die with the nozzle such that the plate is located between the nozzle and the die; placing the die and the plate onto a device, substrate, or another die such that the plate is located on top of the die; and heating the device and the die in a heat chamber while the plate remains on top of the die to permanently attach the die to the device, substrate, or another die.

According to another embodiment, a method comprises: a) picking up a combination of a plate and a die with a nozzle such that the plate is located between the die and the nozzle; b) placing the combination of the plate and the die on a device, substrate, or another die; c) repeating steps a) and b) to populate the device, substrate, or another die with a plurality of combinations of plates and die; d) heating the device, substrate, or another die and the plurality of combinations of plates and die simultaneously to attach each of the die to the device, substrate, or another die; and e) removing each of the plates from each of the die.

According to another embodiment, an assembly system comprises: an assembly machine further comprising: a nozzle configured to pick up a combination of a plate and a die such that the plate is located between the nozzle and the die, wherein the plate includes at least one opening in it to allow air to flow therethrough, and wherein the plate is picked up at a first pickup location and wherein the die is picked up at a second pickup location; and a placement location for placing the combination of the plate and the die on a device, substrate, or another die by the nozzle, wherein the nozzle is configured to populate the device, substrate, or another die with a plurality of the combinations of the plate and the die; and a heat chamber configured to heat the entire device, substrate, or another die to attach the die to the device, substrate, or another die.

BRIEF DESCRIPTION OF THE DRAWINGS

Some embodiments of this invention will be described in detail, with reference to the following figures, wherein like designations denote like members, wherein:

FIG. 1b depicts a cut away view of the plate shown in FIG. 1a;

FIG. 2b depicts a side view of the die with TSV shown in FIG. 2a;

FIG. 4a-4c depicts the process of picking the plate by the nozzle;

FIG. 5a-5C depicts the process of picking the 3D TSV by the nozzle with the plate;

FIG. 6a-6c depicts the process of placing the 3D TSV and plate on a device by the nozzle;

FIG. 7a-7c depicts the process of removing the plate from the 3D TSV mounted on the device via a cleaning process;

DETAILED DESCRIPTION

Figure 3A:
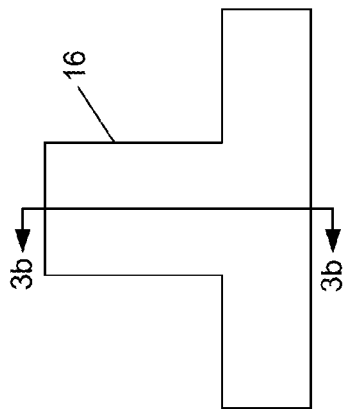
FIG. 3a depicts a side view of a nozzle.
Figure 3B:
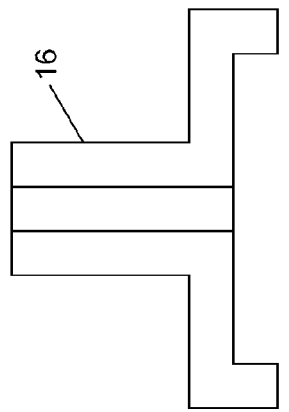
FIG. 3b depicts a cut away view of the nozzle shown in FIG. 3a taken at arrows 3b-3b.
Figure 2A:
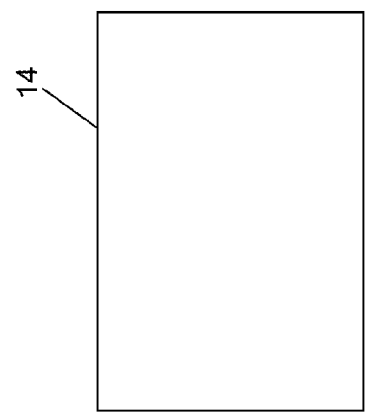
FIG. 2a depicts a top view of a die with TSV.
Figure 2B:
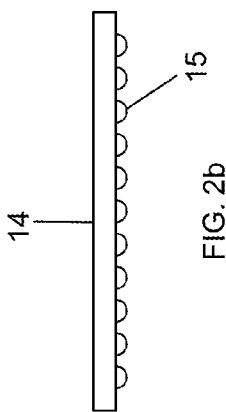
Figure 1A:
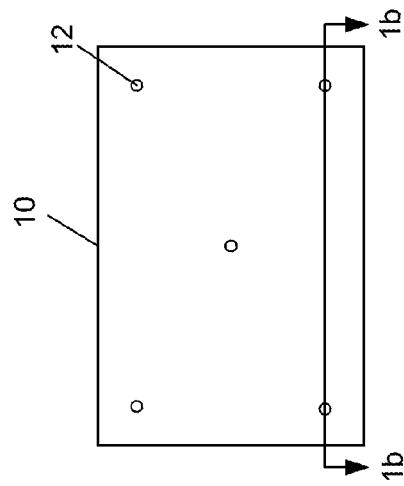
FIG. 1a depicts a top view of a plate.
Figure 1B:
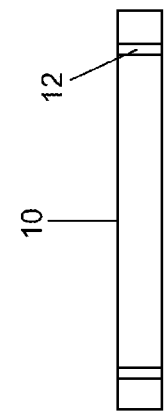

A detailed description of the hereinafter described embodiments of the disclosed apparatus and method are presented herein by way of exemplification and not limitation with reference to the Figures.

Referring to FIGS. 1-6 and 10, a nozzle 16 is shown which may be a part of a pick and place head 110 mounted in an assembly machine 100 of an assembly system 1000. As shown in FIGS. 4a-4c, the nozzle may first pick up from a feeder 112 a plate 10, which is approximately the size of a 3D TSV or die 14 to be placed and attached. This plate 10 may be very flat, and may have a weight that is sufficient to maintain the flatness of the die 14 during a mass reflow process to prevent the "potato chip" effect when the plate 10 is resting on top of the die 14. For example, the plate 10 may weigh as much or more than the die 14. The plate 10 may have a greater thickness than the thickness of the die 14. The plate 10 may be semi permeable to air. The permeability may be created by small orifice type holes 12 in the plate 10. Alternately, the plate 10 may be made out of a sintered material that allows some, but not all air to pass from bottom to top. This may create a pressure difference between the bottom and the top of the plate 10 to allow the plate 10 to be picked up by the suction from the nozzle 16. The plate 10 may be constructed out of a highly un-solderable material to prevent the plate from attaching to the die during the reflow process. In other words, the plate 10 may be made from a material that will not deform when exposed to the heat of a reflow process. The plate 10 may also be polished to such a surface finish that molecular attraction (van der Waal's force) may cause the die 14 to adhere to the plate 10 during the mass reflow/bonding process.

The sequence of the assembly may be as follows. First, a nozzle 16 is lowered on top of the clean flat plate 10, as shown in FIGS. 4a and 4b. The vacuum or suction in the nozzle 16 will build up sufficiently by the limited airflow through the plate 10 caused by the orifice sizing, or the structure of the sintered material of the plate, allowing the plate to be picked up by the nozzle 16, as shown in FIG. 4c. An optional next step would be a vision centering of the plate 10 by a vision system 114 to optimize alignment of the plate 10 with respect to the nozzle 16 prior to picking up the die 14 so that the die 14 will be centered to on the die 14 at the time of the pickup of the die 14.

Once the nozzle 16 has picked up the plate, then the nozzle 16 and plate 10 are lowered to the top of the die 14, as shown in FIGS. 5a and 5b, from another feeder 112. The die 14 may include solder bumps 15 for the mass reflow process. Because the die 14 may not be air permeable like the plate 10, putting the plate 10 in contact with the die as shown in FIG. 5b may close the orifice openings and cause full vacuum to build. This may allow picking the die 14 up underneath the plate 10 by the nozzle 16, as shown in FIG. 5c. Following this, the die 14 may go through the current process steps for flip chip placement, which may include dipping the solder bumps 15 in flux or adhesive, vision centering and placement on the board.

As shown in FIG. 6a, after the picking up of the die 14 and the plate 10 combination, the nozzle 16 may move to a placement location over a substrate, base die, board, or other device 18. When the vacuum is removed from the nozzle 16, the die 14 plus the plate 10 may remain on the substrate, or base die, board or other device 18, as shown in FIG. 6b. At this point, the nozzle 16 may immediately be removed to pick up another plate and die combination 10, 14 for placement on the device 18. It should be understood, therefore, that the nozzle 16 need not include any heating or cooling mechanism. Moreover, no other device of the assembly machine needs to individually heat or cool the die 14 to attach it to the device 18.

Instead of individual heating of the individual die 14 to the device 18, the device 18 may become fully populated by a plurality of the plate and die combinations 10, 14 prior to heating. From here, the populated device 18 may be transferred by the assembly machine 100 to a heat chamber 200 (shown in FIG. 10). The heat chamber 200 may, for example, be an oven chamber or other heating chamber. The populated device 18 may move along the heat chamber 200 in an assembly line type fashion. Alternately, the populated device 18 may move to the center of the heat chamber 200 and may remain there until the mass reflow process is completed. Whatever, the embodiment, the heat chamber 200 may create an environment having a temperature sufficient to melt the solder bumps 15 and attach the die 14 to the device 18.

Figure 9A:
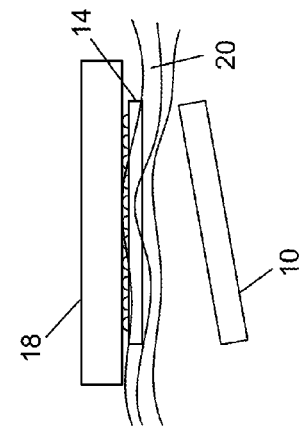
FIG. 9a-9c depicts another process of removing the plate from the 3D TSV mounted on the device via a different cleaning process.
Figure 9B:
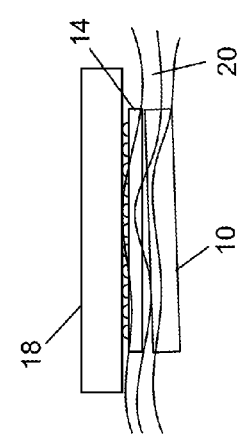
Figure 9C:
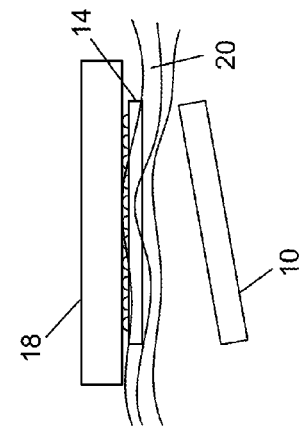

As shown in FIGS. 7 and 9, once the die 14 has been permanently attached to the device 18, the plates 10 can be later removed in a later step by a plate removal machine 300. Plate removal machine 300 could be another assembly machine, a cleaning station or other type of machine. For example, after mass reflow in the heat chamber 200, the populated device 18 may be transferred to plate removal machine 300 and may be turned in a perpendicular position to aid in the removal of the plates 10 from dies 14 via gravity when a fluid 20 is used to facilitate removal of the plates 10, as shown in FIG. 7. This may occur at a plate removal station or location of the plate removal machine 300. The fluid 20 may or may not be necessary depending on the embodiment. For example, simply moving the device 18 and plates 10 in a vertical position as shown in FIG. 7 may remove the plates 10 automatically due to gravity. Instead of being turned vertically, the device 18 and plates 10 may alternately be flipped upside down, as shown in FIG. 9. This embodiment also shows fluid 20 being used help assist in the removal of the plate 10 from the die 14.

Figure 8A:
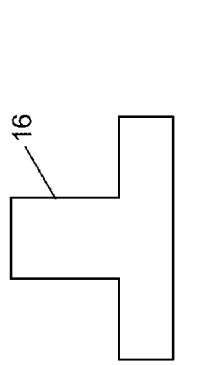
FIG. 8a-8c depicts another process of removing the plate from the 3D TSV mounted on the device by a nozzle.
Figure 8B:
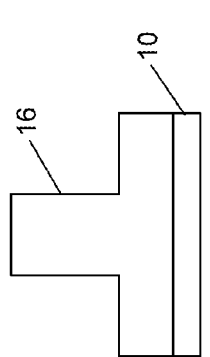
Figure 8C:
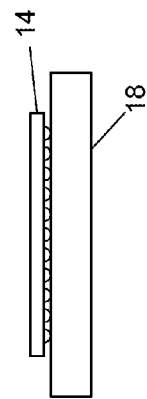
Figure 10:
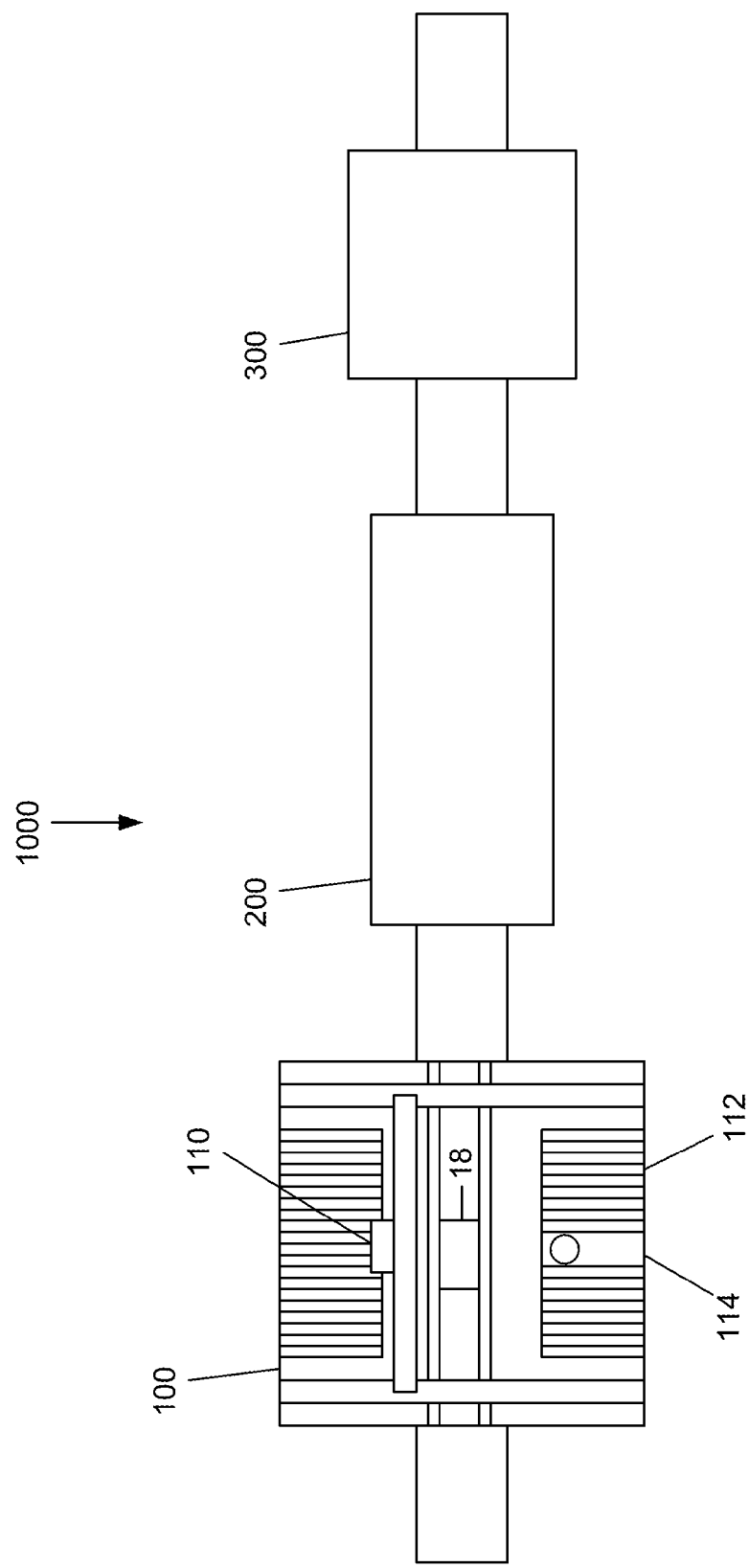
FIG. 10 depicts a top view of an assembly system capable of performing the processes shown in FIG. 4-9.

In another embodiment shown in FIGS. 8a-8c, a nozzle, such as the nozzle 16, may be configured to pick the plate 10 back up off the die 14 after the die 14 has been attached to the device 18. Alternately, a different nozzle (not shown) than the original nozzle 16 may be utilized to pick the plate 10 back up off the die 14 after the heating. Referring now to FIG. 10, the plate removal machine 300 may include one or more removal nozzles, similar to the application nozzle 16, for removing the plate 10 from the die 14. These removal nozzles may be used instead of or in addition to the gravity or fluid methods described hereinabove in FIGS. 7 and 9. In one embodiment, the removal nozzles may be configured to sense any plates 10 that were not removed by other methods in order to pick the unremoved plates 10 off the die 14. In other embodiments, the removal nozzles may be the exclusive removal mechanism, and may be configured to individually pick up each plate 10 from its respective die 14.

It should be understood that the process described hereinabove may be repeated as necessary to add additional layers on top of the first layer of 3D TSV die 14. For example, a single die 14 may be applied as a bottom layer attached directly to the device 18. Then the device 18 may be placed through the assembly machine 100 or another assembly machine (not shown) which runs the exact same process in order to attach a second die layer (not shown) directly on top of the first die 14. This second die may be attached to the first die 14 with the same mass reflow process and using a plate to retain the shape of the die in the exact same manner as described hereinabove.

Thus, the TSV die 14 with plates 10 can be mounted in significantly higher speeds than in prior art processes and the entire fully populated wafer/substrate or device 18, with all the dies 14 and plates 10 can be attached in a mass reflow/bonding process without the risk of curling or potato chip effects on the individual dies 14. This process prevents the need to individually heat and cool the dies 14 right at the time of placement or with a specific individual heating and cooling head. This may create a significant cost reduction for the assembly process of 3D TSV. The output of a one million dollar assembly machine may, for example, be increased by a factor of 50. The above described method and assembly machine may also enable production of the same quantity and speed in a smaller clean room space.

In another embodiment, a layer of material may be attached or otherwise applied to the bottom side of the plate 10 prior to contact with the die 14. This material may either be compliant, adhesive, or provide enhanced friction to allow the plate 10 to better stick to the die 14. Materials such as high temperature silicon rubber could be used for this purpose. These materials may be even somewhat sticky to temporarily adhere to the top of the TSV die 14. These materials may be resistant to heat and may not cause permanent adhesion of the plate 10 with the die 14 and rather may simply assist in creating friction and retaining the plate 10 in the proper position above the die 14 during the movement of the device 18 in the assembly machine 100 and heat chamber 200.

In another embodiment, it may be beneficial to keep the TSV die 14 flat to have a precision ground and a highly polished surface to interface with the plate 10. This way molecular attraction can be the force to attach the plate 10 temporarily to the die 14. In addition the plates 10 may have to have pockets or recesses to prevent contact to sensitive areas or non-flat areas on the top of the die 14. For example, if a die 14 does not include a flat top surface to integrate with the plate 10, the plate 10 may be specifically designed with a surface which corresponds to the surface of the die 14.

The above described apparatus and method for attaching a die to a device may also be used for attaching a die to substrate or another die.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

I claim:

1. A method comprising:
   a) picking up a plate with a nozzle at an assembly machine, the plate including at least one opening to allow air to flow therethrough;
   b) picking up a die with the nozzle such that the plate is located between the nozzle and the die to create a first plate and die combination;
   c) placing the first plate and die combination onto one of a device, substrate or another die such that the plate is located on top of the die;
   d) populating a plurality of plate and die combinations, including the first plate and die combination, on the one of the device, substrate or another die by repeating steps a)-c) at least once;
   e) transferring, after the populating, the plurality of plate and die combinations and the one of the device, substrate or another die and the die from the assembly machine to a heat chamber;
   f) heating the one of the device, substrate or another die and the die and the plurality of plate and die combinations in the heat chamber to permanently attach the dies of the plurality of plate and die combinations to the one of the device, substrate or another die;
   g) transferring, after the heating, the one of the device, substrate or another die and the plurality of plate and die combinations to a plate removal machine; and
   h) removing the plates of the plurality of plate and die combinations from the dies of the plurality of plate and die combinations by the plate removal machine.

2. The method of claim 1, further comprising creating, during the picking step b) by the nozzle, a vacuum between the plate and the die by removing air through the at least one opening.

3. The method of claim 1, further comprising locating the plate on the nozzle with a vision system prior to picking up the die.

4. The method of claim 1, wherein the die includes a plurality of solder bumps that are configured to attach the die to the one of the device, substrate or another die during the heating of the one of the device, substrate or another die in the heat chamber.

5. The method of claim 1, further comprising reusing the plate when placing a second die.

6. The method of claim 1, further comprising attaching a layer of adhesive to a surface of the plate that is located between the plate and the die, the layer of adhesive configured to temporarily attach the plate to the die.

7. The method of claim 1, wherein the removing of the plate from the die is accomplished by orienting the one of the device, substrate or another die vertically such that the plate drops from the die and the one of the device, substrate or another die.

8. The method of claim 1, wherein the removing of the plates of the plurality of plate and die combinations from the dies of the plurality of plate and die combinations is accomplished by picking up the plates of the plurality of plate and die combinations from the dies of the plurality of plate and die combinations with a second nozzle.

9. The method of claim 1, wherein the heat chamber is an oven.

10. The method of claim 1, wherein the heating the plurality of plate and die combinations in the heat chamber occurs while the plurality of plate and die combinations are stationary within the heat chamber.

11. The method of claim 1, wherein the heating the plurality of plate and die combinations in the heat chamber occurs while the plurality of plate and die combinations are moves through the heat chamber.

12. The method of claim 1, further comprising utilizing gravity, by the plate removal machine, for the removing of the plates.

13. The method of claim 1, further comprising turning the plate and die combinations and automatically removing the plates due to gravity, by the plate removal machine.

* * * * *